(12) United States Patent
Chen et al.

(10) Patent No.: US 6,654,412 B1
(45) Date of Patent: Nov. 25, 2003

(54) ADAPTIVE FILTER AND LEARNING METHOD THEREOF

(75) Inventors: Heng Chou Chen, Changhua Hsien (TW); Oscal Tzyh-Chiang Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/521,305

(22) Filed: Mar. 8, 2000

(30) Foreign Application Priority Data

Sep. 16, 1999 (TW) .................................. 88115968 A

(51) Int. Cl.[7] .............................................. H03H 7/40
(52) U.S. Cl. ...................... 375/232; 375/222; 370/290; 379/406.08; 379/406.09; 708/322
(58) Field of Search ................................ 375/222, 232, 375/233, 234, 231, 285, 296, 346, 350; 379/406.01, 406.02, 406.05, 406.06–406.09, 406.1; 370/286, 288, 289, 290, 291, 292; 708/322, 323

(56) References Cited

U.S. PATENT DOCUMENTS

| | | | | |
|---|---|---|---|---|
| 5,428,681 A | * | 6/1995 | Andre | 379/406.08 |
| 5,590,121 A | * | 12/1996 | Geigel et al. | 370/290 |
| 5,638,311 A | * | 6/1997 | Fujii et al. | 708/322 |
| 5,661,795 A | * | 8/1997 | Maeda | 379/412 |
| 5,796,820 A | * | 8/1998 | Sasada | 379/406.08 |
| 6,381,272 B1 | * | 4/2002 | Ali | 375/233 |

OTHER PUBLICATIONS

Martin, R.; Altenhoner, J.; "Coupled Adaptive Filters for Acoustic Echo Control and Noise Reduction", May 9–12, 1995, Acoustics, Speech, and Signal Processing, 1995. International Conference on, Vol.: 5, pp.: 3043–3046.*

Paez–Borrallo, J.M.; Perez Alvarez, I.A.; Bello, S.Z.; "Adaptive Filtering in Data Communications with Self Improved Error Reference", Apr. 19–22, 1994, Acoustics, Speech, and Signal Processing, 1994. International Conference on, V.: 5, p.: III/65–III/68.*

* cited by examiner

Primary Examiner—Chi Pham
Assistant Examiner—Khanh Cong Tran
(74) Attorney, Agent, or Firm—Darby & Darby

(57) ABSTRACT

The present invention provides an adaptive filter and a learning method therefor to eliminate real output signals generated by input signals and an environment signal response. The adaptive filter receives the input signals from an input signal source and generates estimated output signals according to an filter coefficients and the input signals. The first step of the learning method is storing the input signals and the real output signals within a past time period. Then, a predictive input signal and a predictive output signal are generated according to the input signals and the real output signals in the memories, respectively. Finally, the filter coefficients is updated according to the predictive input signal, the predictive output signal, one of the input, signals and one of the real output signals, causing the estimated signals to approximate the real output signals.

20 Claims, 4 Drawing Sheets

ADAPTIVE FILTER AND LEARNING METHOD THEREOF

BACKGROUND OF THE INVENTION

1. Field of the Invention

The present invention generally relates to a learning method of an adaptive filter, and an adaptive filter provided with that learning method. More specifically, the present invention relates to a learning method of an adaptive filter with a predictive updating scheme for acoustic echo cancellation, and to an adaptive filter provided with that learning method.

2. Description of the Related Art

Multi-path echoes of an operating environment result in uncomfortableness to the far-end user in hands-free communications. For example, while a person using a cellular phone without holding it in hand, the receiver (or microphone) receives sounds generated from the loudspeaker and conducted/reflected by the environment. Finally, such sound will transmit to the far-end user and, after a period of time, the far-end user hears the sound previously spoken by the user. Such a phenomenon is called the acoustic echo effect. The effect should be reduced or eliminated by an apparatus, e.g., an acoustic echo canceller.

The most popular way to cancel the acoustic echo effect is to set up an acoustic echo canceller between two signal lines, as shown in FIG. 1. FIG. 1 is the diagram illustrating the acoustic echo effect and the installation of an acoustic echo canceller 24 in the art. The input signals x(t) generated from a far-end input signal source 10 are sent to a loudspeaker 14 via a first signal line 12 for generating sound. The sound is reflected or conducted by the environment 16 and enters the microphone 18 to generate real output signals d(t), that is, an acoustic echo. The real output signals d(t) are sent to the loudspeaker 22 of the far-end user via a second signal line 20, creating the acoustic echo effect. The acoustic echo canceller 24 is installed between the first and the second signal lines (12 and 20, respectively) to learn the room response of the environment 16. The acoustic echo canceller 24 generates estimated signals y(t) according to the input signals x(t) at the first signal line 12 and sends the estimated signals y(t) to the second signal line 20 for canceling the real output signals d(t). Error signals e(t) are defined as the error between the real output signals d(t) and the estimated signals y(t). If the real output signals d(t) and the estimated signals y(t) are very close, then the error signals e (t) that the far-end user hears are small, thus the acoustic echo effect is eliminated. However, the environment 16 is time variant, the acoustic echo canceller 24 needs to automatically trace the changes of the environment. As shown in FIG. 1, the acoustic echo canceller 24 updates its own signal response according to the error signals e(t). Such an acoustic echo canceller 24 with a self-learning function is called an adaptive filter. In particular, an adaptive filter with finite impulse response (FIR) is called an adaptive FIR filter.

FIG. 2 is a functional diagram of an adaptive FIR filter according to the prior art. For illustrative purpose, the operation of the system according to FIG. 2 is a digital system where the continuous time variable t is substituted with a discrete time variable k. x(k) 30 represents the input signals, while H represents the impulse response of the environment. Since the environment is not predictable, the environment is defined as an unknown system 40. $H_k$, the estimated result of H, represents the impulse response of the adaptive FIR filter 34 at the time of k. y(k) 32 represents the estimated output signals generated by the adaptive FIR filter 34, and d(k) 38 represents the real output signals generated by the unknown system 40. For the adaptive FIR filter 34, at least 3 steps are needed to update $H_k$ per iteration, as follows:

Step 1: generating the estimated output signals y(k)

$$y(k) = H_k^T conv X(k) \equiv \sum_{l=0}^{L-1} h(k) * x(k-l) \qquad (1)$$

$X(k) = [x(k-L+1), \ldots, x(k-1), x(k)]^T$ $H_k = [h_k(0), h_k(1), \ldots, h_k(L-1)]^T$ Wherein the superscribed "T" denotes the transport operation, and L denotes the length of the adaptive FIR filter.

Step 2: calculating the error signals e(k) 36

$$e(k) \equiv d(k) - y(k) \qquad (2)$$

and;

Step 3: updating the coefficients of $H_k$ $$H_{k+1} = \Phi[H_k] \qquad (3)$$

Wherein, $\Phi[.]$ denotes the updating algorithm.

If the normalized least-mean-square (NLMS) algorithm is applied, for example, then $$H_{k+1} = H_k + \mu/|X|^2 * e(k) * X(k) \qquad (3a)$$

Wherein $\mu$ denotes a fixed step size for updating. From the Eq.(1), Eq(2) and Eq.(3), (2L+1) operations of multiplication and 2L operations of addition are needed for learning per iteration for the adaptive FIR filter 34 with such an NLMS algorithm. However, only one time of learning and one updating the coefficients of $H_k$ is achieved after the adaptive FIR filter receives one of the input signals x(k) when such an NLMS algorithm is used. Thus, it is well-known that the efficiency, or more particularly, the convergence rate of such an NLMS algorithm is very slow when the input signals are color.

In addition to the learning method using the NLMS algorithm as mentioned above, the prior art provides a multiple learning method performing multiple updating using the input signals x(k) received. For the purpose of multiple updating, the input signals x(k) 30 and the real output signal d(k) 38 must be stored. Given that M times of revisions are desired, the stored input signal x(k) 30 can be represented as $X(k), X(k-1), X(k-2), \ldots, X(k-M+1)$.

The stored real output signal d(k) 38 can be represented as:

$d(k), d(k-1), d(k-2), \ldots, d(k-M+1)$.

Thus the algorithm of the multiple learning method becomes:

For m=1 to M

Update $H_k$ using $X(k-m+1)$ and $d(k-m+1)$

End

The adaptive FIR filter 34 experiences M revisions after receiving each of the input signals x(k) 30. These additional revisions can significantly speed up the convergence rate of the NLMS algorithm. However, M revisions require M*(2L+1) operations of multiplication and 2*M*L operations of addition. Such an algorithm leads to an huge number of calculations and results in a complex system.

Therefor, there is a general need for an adaptive filter and a learning method thereof that overcome the aforementioned problems in the art. In particular, an adaptive filter and learning method thereof are needed to improve the adaptation of the adaptive filter with a relatively low number of operations, and to achieve an optimized convergence rate.

SUMMARY OF THE INVENTION

The present invention provides a learning method for canceling real output signals generated by input signals and an environment signal response. The adaptive filter receives the input signals from an input signal source and generates estimated output signals according to an filter coefficients and the input signals. The first step of the learning method according to the present invention is storing the input signals and the real output signals within a past time period. Then a predictive input signal is generated according to the input signals to predict one of the input signals at the next sampling duration. A predictive output signal is also generated according to the real output signals to predict one of the real output signals at the next sampling duration. Finally, using the predictive input signal, the predictive output signal, the input signals and the output signals as data, the filter coefficients is updated, causing the estimated signals to approximate the real output signals.

The present invention also provides an adaptive filter for canceling real output signals generated by input signals and an environment signal response. The adaptive filter receives the input signals from an input signal source to generate estimated signals. The adaptive filter comprises a filter, a plurality of memories, a first predictor, a second predictor and a controller. The filter generates the estimated signals according to an filter coefficients and the input signals. The memories store the input signals and the real output signals within a past time period. The first predictor generates a predictive input signal according to the input signals in the memories. The second predictor generates a predictive output signal according to the real output signals in the memories. The controller updates the filter coefficients according to the predictive input signal, the predictive output signal, the input signals and the output signals, causing the estimated signals to approximate the real output signals.

An efficient way to obtain the predictive input signal and the predictive output signal is also provided in the present invention. The random property of input signals is reduced, using an accumulated generating operation, an exponential operation, a polynomial fitting, a simplified logarithmic operation and an inverse-accumulated operation.

BRIEF DESCRIPTION OF THE DRAWINGS

These and further features, aspects and advantages of the present invention, as well as the structure and operation of various embodiments thereof, will become readily apparent with reference to the following detailed description of a presently preferred, but nonetheless illustrative embodiment when read in conjunction with the accompanying drawings, in which like reference numbers indicate identical or functionally similar elements throughout the enumerated Figures. The drawings referred to herein will be understood as not being drawn to scale except if specially noted, the emphasis instead being placed upon illustrating the principles of the present invention In the accompanying drawings.

DETAILED DESCRIPTION OF THE PREFERRED EMBODIMENTS

Reference is now made in detail to an embodiment of the present invention that illustrates the best mode presently contemplated by the inventor(s) for practicing the present invention. Other embodiments are also described herein.

Figure 3:
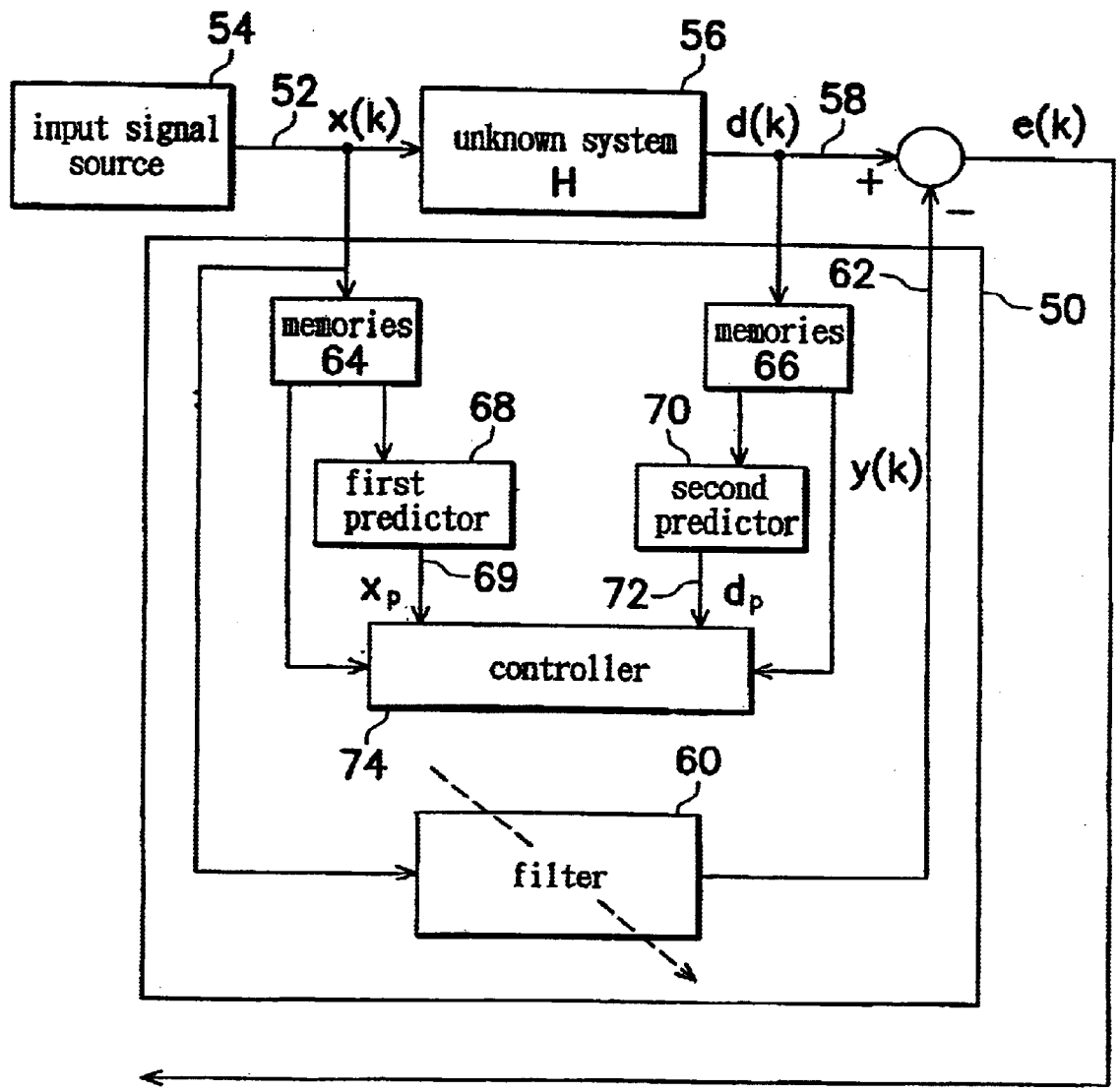
FIG. 3 is a functional diagram of an adaptive filter according to the present invention.

FIG. 3 is a functional diagram of an adaptive filter according to the present invention. The adaptive filter 50 according to the present invention is connected to an input signal source 54 for generating input signals x(k) 52. The adaptive filter 50 is also parallel connected to an environment. Since the environment is unknown and unpredictable, the environment is defined as an unknown system 56. The unknown system 56 has an unknown impulse response H to generate real output signals d(k) 58 according to the input signals x(k) 52. The adaptive filter 50 comprises a filter 60 for generating the estimated signals y(k) 62 according to an filter coefficients $H_k$ and the input signals x(k) 52 to cancel the real output signals d(k) 58. The adaptive filter 50 also comprises a plurality of memories 64 and 66 for recording the input signals x(k) 52 and the real output signals d(k) 58 within a past time period. The adaptive filter 50 further comprises a first predictor 68 for generating a predictive input signal $x_p$ 69 according to the input signals x(k) 52 in the memories 64. The predictive input signal $x_p$ 69 predicts the next sample of the input signals x(k) 52 at the next sampling duration. The adaptive filter 50 further comprises a second predictor 70 for generating a predictive output signal $d_p$ 72 according to the real output signals d(k) 58 in the memories 66. The predictive output signal $d_p$ 72 predicts the next sample of the real output signals d(k) 58 at the next duration. A controller 74 is also included in the adaptive filter 50 for updating the filter coefficients $H_k$ of the filter 60 to make the estimated signals y(k) 62 approximate to the real output signals d(k) 58. More particularly, the controller 74 updates the filter coefficients $H_k$ according to the predictive input signal $x_p$ 69, the predictive output signal $d_p$ 72, the input signals x(k) 52 and the real output signals d(k) 58.

The present invention, in terms of the data used in updating the coefficients of the filter 60, uses not only the past information, such as the input signals x(k) 52 and the real output signals d(k). 58, but also the additionally estimated information, such as the predictive input signal $x_p$ 69 and the predictive output signal $d_p$ 72. Furthermore, the present invention also provides a easy and reliable predicting method to predict the possible values of the input signals x(k) 52 and the real output signals d(k) 58.

For illustrative purpose, only the closest three data of the input signals x(k) 52 and the real output signals d(k) 58 in the memories 64 and 66 are used in generating the predictive input signal $x_p$ 69 and the predictive output signal $d_p$ 72 in this embodiment of the present invention. The method for generating the predictive output signal $d_p$ 72 is similar as that for generating $x_p$ 69. The least three data of the input signals x(k) 52 are defined as an input series $X_0$=[x(1), x(2),x(3)]. The purpose of the predicting process steps according to the present invention is to predict x(4), the next element of the input series $X_0$, i.e., the predictive input signal $x_p$ 69.

The simplest predicting method is the polynomial fitting. For example,-a second order polynomial equation is applied to fit x(1), x(2) and x(3), as shown in Eq.10:

$$x(k)=P_0+P_1*k+P_2*k^2, k=1,2,3 \tag{10}$$

Thus, There are three unknown coefficients $P_0$, $P_1$ and $P_2$ in the equations when k=1,2,3 are considered respectively. $P_0$, $P_1$ and $P_2$ are derived through matrix operations, such as the operations of linear algebra which are known in the art. After $P_0$, $P_1$ and $P_2$ are found, set k in Eq. (10) equal to 4 and then the predicting value x(4) can be obtained.

Figure 4:
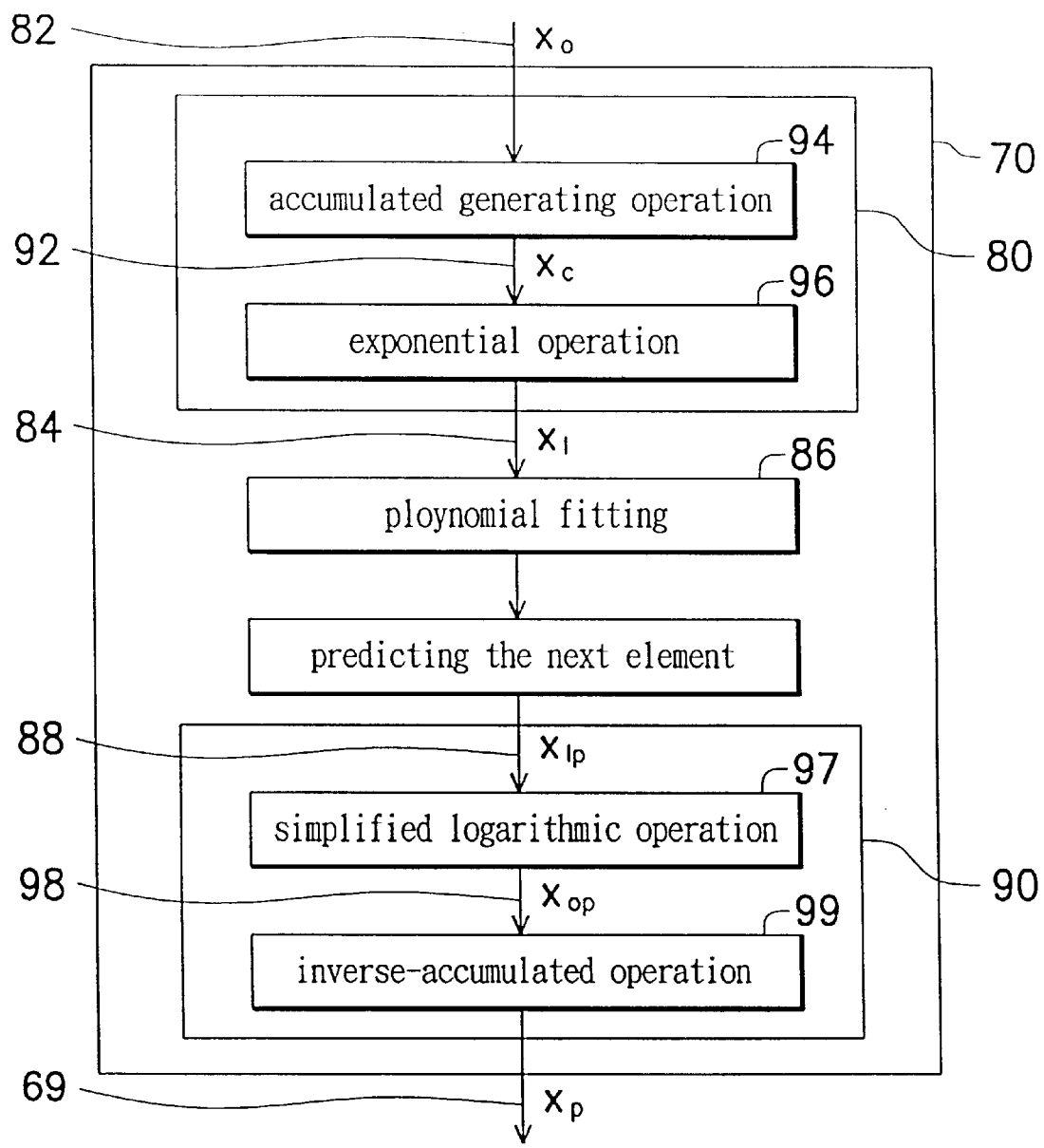
FIG. 4 is a functional flow diagram of the first predictor according to the present invention as shown in FIG. 3.

FIG. 4 is a functional flow diagram illustrating the first predictor according to the present invention as shown in FIG. 3. In order to reduce the random property of x(1), x(2) and x(3), the present invention further provides a transformation 80 to convert the input series $X_0$ 82 to a first series $X_1$ 84 with deterministic property. Then, the polynomial fitting 86 is applied to fit the first series $X_1$ 84 and a predictive value $x_{1p}$ 88 is obtained for predicting the next element of the first series $X_1$ 84, as discussed above. Then, an inverse transformation 90, which is the inverse of the transformation 80, for recovering the element of the first series $X_1$ 84 to the element of the input series $X_0$ 82, is applied to recover $x_{1p}$ 88 to the same domain of the input series $X_0$ 82. Thus, the next element of the input series $X_0$, x(4) is obtained, which is the predictive input signal $x_p$ 69.

As shown in FIG. 4, there are two steps in the transformation 80. The first step is an accumulated generating operation (AGO) 94 for generating an accumulated series $X_c$ 92, as shown in the following Eq.12.

$$X_c=[x_c(1), x_c(2), x_c(3)]=[x(1), x(1)+x(2), x(1)+x(2)+x(3)] \tag{12}$$

Given that all the elements of input series $X_0$ are the sampling signals and larger than zero, from Eq.12, the accumulated series $X_c$ 92 is a monotonically increasing series. The second step is named as an exponential operation 96 for generating the first series $X_1$ 84, as shown in the following:

$$X_1=[x_1(1), x_1(2), x_1(3)] \tag{14a}$$

$$x_1(k)=\exp(x_c(k)/M), k=1,2,3 \tag{14b}$$

Wherein, M is a predetermined number which is larger than any element of the accumulated series $X_c$ 92. However, exponential operations increase the computational complexity. Therefore, we set M>>max{$x_c(1)$, $x_c(2)$, $x_c(3)$}, and equation 14b can be simplified as:

$$x_1(k)=1+x_c(k)/M, k=1,2,3 \tag{14b'}$$

for saving computational complexity.

As shown in FIG. 4, the inverse transformation 90 comprises two steps. The first step is a simplified logarithmic operation 97 for recovering $x_{1p}$ to $x_{cp}$ 98, the next element of the accumulated series $X_c$ 92. The simplified logarithmic operation 97 is defined as $$x_{cp}=M*(x_{1p}-1). \tag{16}$$

The second step of the inverse transformation 90 is an inverse-accumulated operation 99 for recovering $x_{cp}$ 98 to $x_p$ 69, the next element of the input series $X_0$ 82. The inverse-accumulated operation 99 is defined as $$x_p=x_{cp}-x_c(3). \tag{18}$$

The process steps for generating the predictive input signal $x_p$ 69 according to the present invention are summarized in the following:

(1) Performing the accumulated generating operation to generate the accumulated series $X_c$ 92;

(2) Performing the exponential operation 96 to generate the first series $X_1$ 84;

(3) Performing the polynomial fitting 86 to find the coefficients of the polynomial equation, $p_0$, $P_1$ and $P_2$;

(4) Generating the predictive value $x_{1p}$ 88 according to the polynomial equation;

(5) Performing the simplified logarithmic operation 97 for recovering $x_{1p}$ 88 to $x_{cp}$ 98; and (6) Performing the inverse-accumulated operation 99 for recovering $X_{cp}$ 98 to $x_p$ 69.

Once the predictive input signal $x_p$ 69 and the predictive real output signal $d_p$ 72 are obtained, the controller 74 can update the filter coefficients $H_k$ of the filter 60 according to the predictive input signal $x_p$ 69, the predictive output signal $d_p$ 72, the input signals x(k) 52 and the real output signals d(k) 58 to make the estimated signals approximate to the real output signals. The method according to the present invention for updating the filter coefficients $H_k$ can be split into two steps. The first step is updating the filter coefficients $H_k$ of the adaptive filter according to the original messages, such as the input signals x(k) 52 and the real output signals d(k) 58. The second step is updating the filter-coefficients $H_k$ of the adaptive filter according to the predictive messages, such as the predictive input signal $x_p$ 69 and the predictive output signal $d_p$ 72. The updating method can be the single learning method or the multiple learning method as used in the prior art. The mathematical algorithms for the first step and the second step can be NLMS algorithms. After updating the filter 60, the filter 60 generates the estimated signals y(k) 62 which approximate to the real output signals d(k) 58.

The present invention is not constrained to using the last three sampled data to obtain the predictive data. At least three sampling data of the input signals and the real output signals within a past time period of time stored in the memories are preferred in this embodiment of the present invention to respectively serve an original input series and an original real output series as the input series of the mathematical operation for obtaining the predictive data. The more of the data provided, the more accurate the predictive data. However, the cost for storing the past data is increased if higher accuracy of predictive data is desired. The predicting method also need not be the polynomial fitting (as discussed above). Many kinds of equations, such as exponential and linear equations, can be employed to predict the data. More than one data point in the future can be obtained according to the present invention. However, the more data are predicted, the more error result which may not be beneficial for convergence of the estimated and real output signals.

In comparison with the single learning method and the multiple learning method according to the prior art, the data in the past are provided for updating the filter 60. However, the adaptive filter according to the present invention further provides the additionally estimated information, i.e., the predictive data, to update the filter 60. It can be seen from the result of testing that the total number of operations and the rate of convergence are both improved by the present invention, which are detailed below.

EXAMPLE

Figure 1:
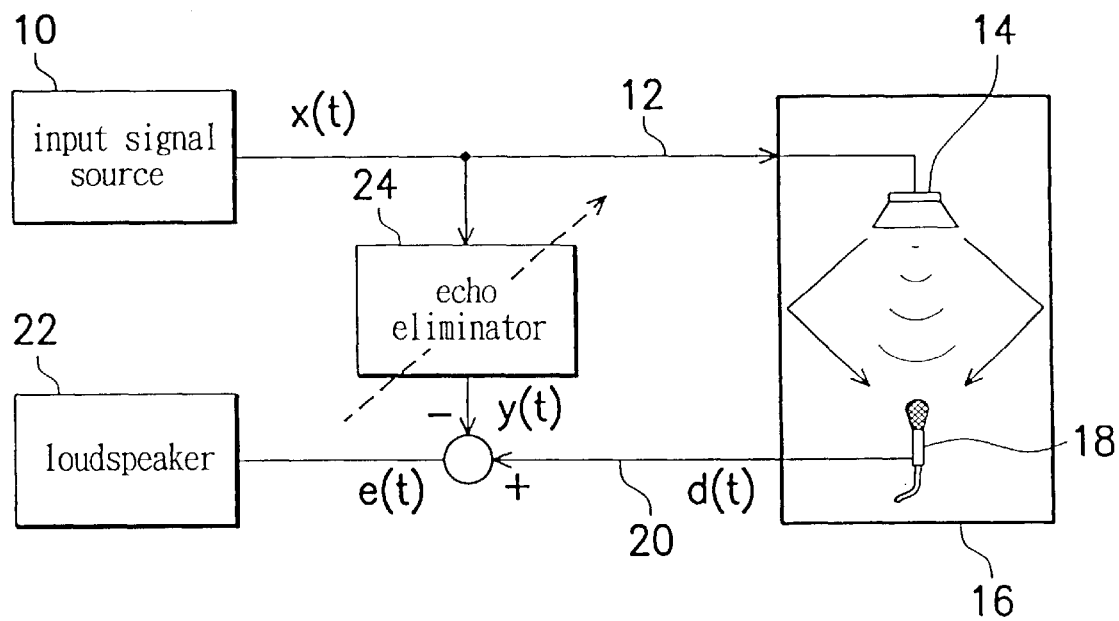
FIG. 1 is the diagram illustrating the acoustic echo effect and the installation of an acoustic echo eliminator in the art.
Figure 2:
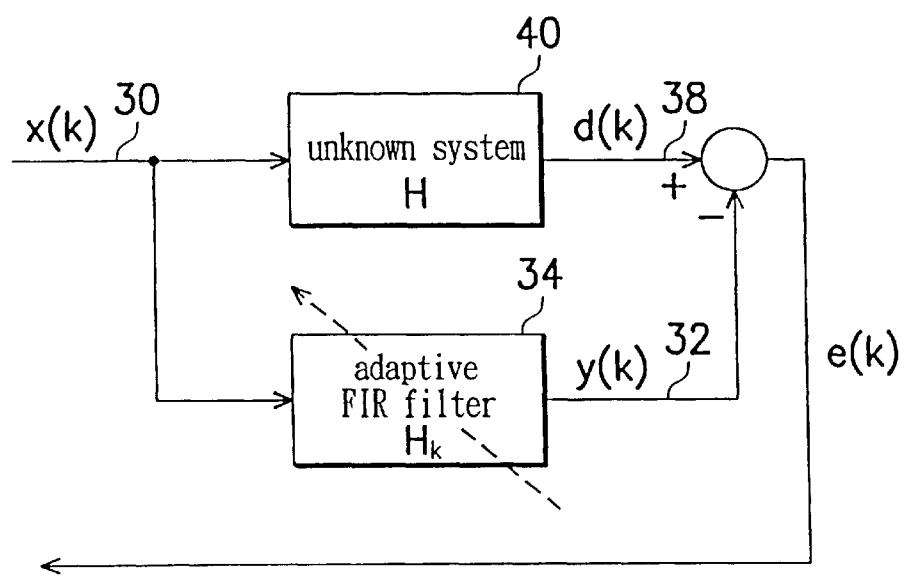
FIG. 2 is a functional diagram of an adaptive FIR filter according to the prior art.
Figure 5:
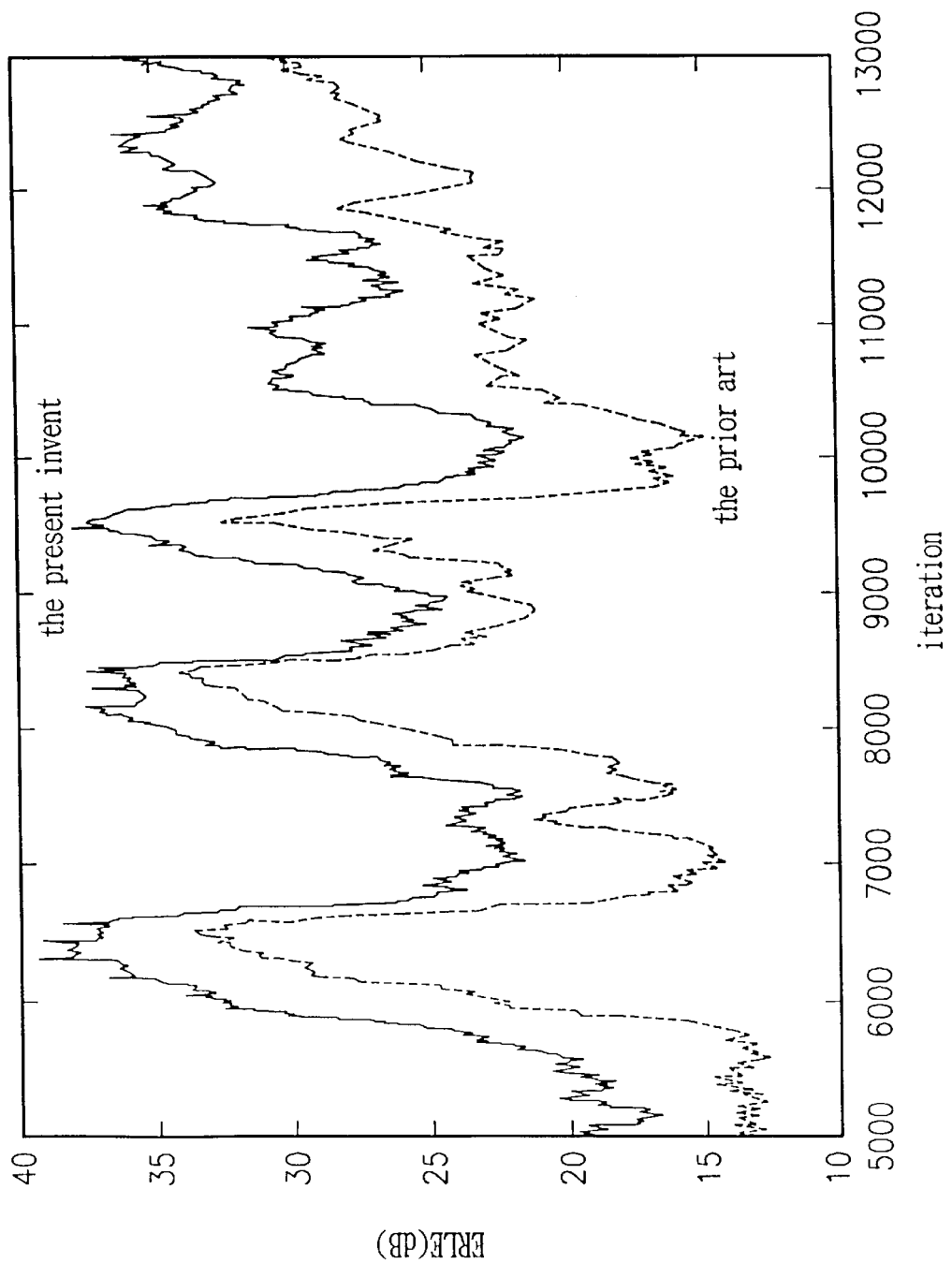
FIG. 5 is a comparison diagram of the abilities for canceling acoustic echo effect between the prior art and one according to the present invention.

FIG. 5 is a comparison diagram of the abilities for canceling acoustic echo effect between an adaptive filter in the prior art and one according to the present invention. The learning method of the prior art is similarly illustrated in FIG. 2, while the exemplary learning method of the present invention is similarly shown in FIG. 3. The unknown systems 40 and 56 used in the prior art and the present invention are the same. Then, the deviations between the estimated signal y(k) 32 and 62 and the real output signals d(k) 38 and 58 are respectively compared according to these two methods according to the prior art and the present invention.

The unknown system has a microphone, a loudspeaker and a response room. The dimension of the response room is $3 \times 3 \times 3.5$ m$^3$, the sampling rate of the signals is 8 kHz, each datum is digitized by 16 bit, the length of the filter is 512, the polynomial fitting is based on the past three data, and the order of the polynomial equation is 2. FIG. 5 shows the acoustic echo cancelling abilities of the learning methods according to the prior art and the present invention. The acoustic echo cancelling ability, the echo return loss enhancement (ERLE), is defined herein as:

$$ERLE = 10 * \log_{10}(E[d^2(n)]/E[e^2(n)])(dB).$$

The solid line in the FIG. 5 shows the acoustic echo cancelling ability of the learning method according to the present invention. The dotted line shows the cancelling ability of the learning method whose number of repetitive updates is 5 (M=10) according to the prior art. The average performance of the present invention is demonstrably better than that of the prior art with 10 dB. More particularly, the total number of operation according to the present invention is only about one-third of that according to the prior art. To obtain the performance of the present invention, the prior art would require 5 times as many operations as the present invention. All these results show the demonstrated advantages of the present invention over the prior art.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Similarly, any process steps described herein may be interchangeable with other steps in order to achieve the same result. Therefore, the scope of the appended claims should be accorded the broadest interpretation so as to encompass all such modifications and similar arrangements, which is defined by the following claims and their equivalents.

What is claimed is:

1. A learning method for an adaptive filter to eliminate real output signals generated by input signals and an environment signal response, the adaptive filter receiving the input signals and generating estimated output signals according to a filter coefficients and the input signals, the learning method comprising the steps of:

(a) storing the input signals and the real output signals within a past time period;

(b) generating a predictive input signal according to the input signals to predict one of the input signals at a time in the future;

(c) generating a predictive output signal according to the real output signals to predict one of the real output signals at a time in the future; and (d) updating the filter coefficients according to the predictive input signal, the predictive output signal, one of the input signals and one of the real output signals to cause the estimated signals approximate to the real output signals.

2. The learning method of claim 1, wherein the environment signal response is due to a environment system, the environment system comprising:

a sound generator generating sound according to the input signals; and a sound receiver receiving sound generated by the sound generator and the environment to generate the real output signals.

3. The learning method of claim 1, wherein the predictive input signal is generated by a mathematical operation with the input signals as variables, the predictive output signal generated by the mathematical operation with the real output signals as variables.

4. The learning method of claim 3, wherein variables of the mathematical operation are arranged as an input series, at least three sampling data of the input signals and the real output signals within a past time period are stored to respectively serve an original input series and an original real output series as the input series of the mathematical operation.

5. The learning method of claim 4, wherein both the number of the elements in the original input series and the number of the elements in the original real output series are more than 3.

6. The learning method of claim 4, wherein the method for generating the predictive signal comprising the steps of:

(e) providing a predetermined function with a plurality of coefficients, a transformation converting a referenced input series to a referenced output series, and an inverse transformation recovering the element of the referenced output series to the element of the referenced input series;

(f) generating a first series according to the input series and the transformation, (g) calculating the coefficients of the predetermined function to approximate the first series according to the first series and the predetermined function;

(h) generating a predictive value to predict the next element of the first series according to the coefficients and the predetermined function; and (i) generating the predictive signal according to the predictive value and the inverse transformation.

7. The learning method of claim 6, wherein the first series is a monotonous series.

8. The learning method of claim 6, wherein the transformation comprises the steps of:

(j) generating an accumulated series, each element of the accumulated series being calculated by accumulating a plurality number of the elements of the input series; and (k) generating the first series according to the accumulated series.

9. The learning method of claim 8, wherein each element according to the first series is calculated by an exponential operation to a respective element of the accumulated series.

10. The learning method of claim 8, wherein step (f) comprises the steps of:

(l) defining a predetermined number which is larger than any element of the accumulated series; and (m) generating the first series, wherein each element of the first series is equal to a respective element of the accumulated series divided by the predetermined number plus one.

11. The learning method of claim 6, wherein the predetermined function is a polynomial function.

12. The learning method of claim 6, wherein the order of the polynomial function is not less than 2.

13. The learning method of claim 1, wherein the adaptive filter is a finite impulse response (FIR) filter.

14. The learning method of claim 1, wherein the step of updating the filter coefficients is achieved by a normalized least-mean-square (NLMS) algorithm.

15. The learning method of claim 1, wherein the step of updating the filter coefficients in the step (d) comprises the steps of:

(n) updating the filter coefficients according to one of the input signals and one of the real output signals to cause the estimated signals approaching the real output signals; and (o) updating the filter coefficients according to the predictive input signal and the predictive output signal signals to cause the estimated signals approaching the real output signals.

16. The learning method of claim 15, wherein the step of updating the filter coefficients is achieved using a normalized least-mean-square (NLMS) algorithm.

17. An adaptive filter for canceling real output signals generated by input signals and an environment signal response, the adaptive filter receiving the input signals from a input signal source and generating estimated signals, the adaptive filter comprising:

a filter generating the estimated signals according to an filter coefficients and the input signals;

a plurality of memories for storing the input signals and the real output signals within a past time period;

a first predictor generating a predictive input signal according to the input signals in the memories;

a second predictor generating a predictive output signal according to the real output signals in the memories; and a controller for updating the filter coefficients according to the predictive input signal, the predictive output signal, one of the input signals and one of the real output signals to cause the estimated signals approaching the real output signals.

18. The adaptive filter of claim 17, wherein the controller updates the filter coefficients by:

(a) updating the filter coefficients according to one of the input signals and one of the real output signals to cause the estimated signals approaching the real output signals; and (b) updating the filter coefficients according to the predictive input signal and the predictive output signal signals to cause the estimated signals approaching the real output signals.

19. The adaptive filter of claim 17, wherein the adaptive filter is a finite impulse response (FIR) filter.

20. The adaptive filter of claim 17, wherein the controller updates the filter coefficients using a normalized least-mean-square (NLMS) algorithm.

* * * * *